(12) United States Patent
Dunn et al.

(10) Patent No.: US 6,809,024 B1
(45) Date of Patent: Oct. 26, 2004

(54) METHOD TO FABRICATE HIGH-PERFORMANCE NPN TRANSISTORS IN A BICMOS PROCESS

(75) Inventors: James S. Dunn, Jericho, VT (US); Natalie B. Feilchenfeld, Jericho, VT (US); Qizhi Liu, Essex Junction, VT (US); Andreas D. Stricker, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/249,821

(22) Filed: May 9, 2003

(51) Int. Cl.[7] ............................................. H01L 29/72
(52) U.S. Cl. ........................ 438/623; 438/625; 438/630
(58) Field of Search ................................ 438/623, 625, 438/630; 257/575

(56) References Cited

U.S. PATENT DOCUMENTS

| | | |
|---|---|---|
| 5,015,594 A | 5/1991 | Chu et al. |
| 5,128,271 A | 7/1992 | Bronner et al. |
| 5,179,036 A | 1/1993 | Matsumoto |
| 5,340,753 A | 8/1994 | Bassous et al. |
| 5,523,606 A | 6/1996 | Yamazaki |
| 5,591,656 A | 1/1997 | Sawada |
| 5,620,908 A | 4/1997 | Inoh et al. |
| 5,654,211 A | 8/1997 | Ham |
| 6,492,238 B1 | 12/2002 | Ahlgren et al. |

OTHER PUBLICATIONS

Patton et al, IEEE Electron Device Letters, vol. 11, No. 4, Apr. 1990.*
"The High Quality Low Temperature Oxidation Technology in a Quasi Self–Aligned SiGe HBT." Lai, et al., Proceedings EDMO 2001/Vienna, 2001 IEEE, pp. 77–82.
"Microwave Transformers, Inductors, and Transmission Lines Implemented in an Si/SiGe HBT Process." Laney, et al., IEEE Transactions on Microwave Theory and Techniques, vol. 49, No. 8, Aug. 2001, pp. 1507–1510.
"All Silicon Nonlinear Transmission Line integrated into a Si/SiGe Heterostructure Bipolar Transistor process". Birk, et al., 2000 IEEE, pp. 75–78.
"Comparison between MBE–based SiGe/Si HBT and Si–based Bipolar Transistor Technologies." Liu, et al., 2001 IEEE, pp. 623–626.
"Current Gain Rolloff in Graded–Base SiGe Heterojunction Bipolar Transistors." Crabbe, et al, IEEE Electron Device Letters, vol. 14, No. 4, Apr. 1993, pp. 193–195.
"Current Status and Future Trends of SiGe BiCMOS Technology". Harame, et al., IEEE Transactions on Electron Devices, vol. 48, No. 11, Nov. 2001.
"Design of 200GHz SiGe HBT's". van den Oever et al., 2001 IEEE BCTM 4.3, pp. 78–81.
"Emitter Base Junction ESD Reliability of an Epitaxial Base Silicon Germanium Heterojunction Bipolar Transistor." Voldman, et al., 2001 IEEE, Proceedings of 8th IPFA 2001, Singapore, pp. 79–84.

(List continued on next page.)

Primary Examiner—Edward Wojciechowicz
(74) Attorney, Agent, or Firm—Scully, Scott, Murphy & Presser; William D. Sabo, Esq.

(57) ABSTRACT

A method of forming a quasi-self-aligned heterojunction bipolar transistor (HBT) that exhibits high-performance is provided. The method includes the use of a patterned emitter landing pad stack which serves to improve the alignment for the emitter-opening lithography and as an etch stop layer for the emitter opening etch. The present invention also provides an HBT that includes a raised extrinsic base having monocrystalline regions located beneath the emitter landing pad stack.

11 Claims, 3 Drawing Sheets

OTHER PUBLICATIONS

"50–GHz Self–Aligned Silicon Bipolar Transistors with Ion–Implanted Base Profiles." Warnock, et al., IEEE Electron Device Letters, vol. 11, No 10, Oct. 1990.

"A 50–GHz Static Frequency Divider and 40–Gb/s MUX/DEMUX Using Self–Aligned Selective–Epitaxial–Growth SiGe HBTs with 8–ps ECL" Washio, et al., IEEE Transactions on Electron Devices, vol. 48, No. 7, Jul. 2001 pp. 1482–1487.

"Fully Coupled Electrothermal Mixed–Mode Device Simulation of SiGe HBT Circuits." Grasser, et al., IEEE Transactions on Electron Devices, vol. 48, No. 7, Jul. 2001 pp. 1421–1427.

"High power X–band (8.4GHz) Si heterojunction bipolar transistor." Ma, et al., Electronics Letters 7th Jun. 2001, Vol. 37, No. 12, pp. 790–791.

"HBT before CMOS, a New Modular SiGe BiCMOS Integration Scheme." Knoll, et al., 2001 IEEE, pp. 22.2.1–22.2.4.

"HBT Low–Noise Performance in a 0.18 um SiGe BICMOS Technology." Greenberg, et al., 2000 IEEE MTT–S Digest, pp. 9–12.

"Modelling Two SiGe HBT Specific Features For Circuit Simulation." Paasschens, et al., IEEE BCTM 2.2, 2001. IEEE, pp. 38–41.

"On the Profile Design and Optimization of Epitaxial Si– and SiGe–Base Bipolar Technology for 77 K Applications—Part I: Transistor DC Design Considerations." Cressler, et al., IEEE Transactions on Electron Devices, vol. 40, No. 3, Mar. 1993, pp. 525–541.

"Profile Design Issues and Optimization of Epitaxial Si and SiGe–Base Bipolar Transistors and Circuits for 77K Applications." Cressler, et al., VLSI Technology, 1991. Digest of Technical Papers., 1991, pp. 69–70.

Review of Silicon–Germanium BiCMOS Technology after 4 Years of Production and Future Directions. Subbanna, et al., 2000 IEEE GaAs Digest, pp. 7–10.

"73–GHz Self–Aligned SiGe–Base Bipolar Transistors with Phosphorus–Doped Polysilicon Emitters." Crabbe, et al., IEEE Electron Device Letters, vol. 13, No. 5, May 1992, pp. 259–261.

"75–GHz ft SiGe–Base Heterojunction Bipolar Transistors." Patton, et al., IEEE Electron Device Letters, vol. 11, No. 4, Apr. 1990, pp. 171–173.

"SiGe–Base Heterojunction Bipolar Transistors: Physics and Design Issues." Patton, et al., Electron Devices Meeting, 1990. Technical Digest., International, 1990 IEEE, pp. 13–16.

"SiGe Power Heterojunction Bipolar Transistors (HBT's) Fabricated by Fully Self–Aligned Double Mesa Technology." Lu, et al., 2001 IEEE MTT–S Digest, pp. 1709–1712.

"A Technology Simulation Methodology for AC–Performance Optimization of SiGe HBTs." Johnson, et al., 2001 IEEE, IEDM 01, pp. 489–492.

A 210–GHz ft SiGe HBT With a Non–Self–Aligned Structure. Jeng, et al., IEEE Electron Device Letters, vol. 22, No. 11, Nov. 2001, pp. 542–544.

A 0.2–um 180–GHzfmax 6.7–ps–ECL SOI/HRS Self–Aligned SEG SiGe HBT/CMOS Technology for Microwave and High–Speed Digital Applications. Washio, et al., IEEE Transactions on Electron Devices, vol. 49, No. 2, Feb. 2002, pp. 271–278.

"A 0.24 um SiGe BiCMOS Mixed–Signal RF Production Technology Featuring a 47 GHz ft HBT and 0.18 um Leff CMOS." St. Onge, et al., 1999 IEEE BCTM 7.2, pp. 117–120.

* cited by examiner

METHOD TO FABRICATE HIGH-PERFORMANCE NPN TRANSISTORS IN A BICMOS PROCESS

BACKGROUND OF INVENTION

1. Field of the Invention

The present invention relates generally to a bipolar transistor and, more particularly, to a method for forming a bipolar transistor with a raised extrinsic base in an integrated bipolar and complementary metal oxide semiconductor (BiCMOS) transistor circuit.

2. Background of the Invention

Bipolar transistors are electronic devices with two p-n junctions that are in close proximity to each other. A typical bipolar transistor has three device regions: an emitter, a collector, and a base disposed between the emitter and the collector. Ideally, the two p-n junctions, i.e., the emitter-base and collector-base junctions, are in a single layer of semiconductor material separated by a specific distance. Modulation of the current flow in one p-n junction by changing the bias of the nearby junction is called "bipolar-transistor action."

If the emitter and collector are doped n-type and the base is doped p-type, the device is an "npn" transistor. Alternatively, if the opposite doping configuration is used, the device is a "pnp" transistor. Because the mobility of minority carriers, i.e., electrons, in the base region of npn transistors is higher than that of holes in the base of pnp transistors, higher-frequency operation and higher-speed performances can be obtained with npn transistor devices. Therefore, npn transistors comprise the majority of bipolar transistors used to build integrated circuits.

As the vertical dimensions of the bipolar transistor are scaled more and more, serious device operational limitations have been encountered. One actively studied approach to overcome these limitations is to build transistors with emitter materials whose band gaps are larger than the band gaps of the material used in the base. Such structures are called heterojunction transistors.

Heterostructures comprising heterojunctions can be used for both majority carrier and minority carrier devices. Among majority carrier devices, heterojunction bipolar transistors (HBTs) in which the emitter is formed of silicon (Si) and the base of a silicon-germanium (SiGe) alloy have recently been developed. The SiGe alloy (often expressed simply as silicon-germanium) is narrower in band gap than silicon.

The advanced silicon-germanium bipolar and complementary metal oxide semiconductor (BiCMOS) technology uses a SiGe base in the heterojunction bipolar transistor. In the high-frequency (such as multi-GHz ) regime, conventional compound semiconductors such as GaAs and InP currently dominate the market for high-speed wired and wireless communications. SiCe BiCMOS promises not only a comparable performance to GaAs in devices such as power amplifiers, but also a substantial cost reduction due to the integration of heterojunction bipolar transistors with standard CMOS, yielding the so-called "system on a chip."

For high-performance HBT fabrication, yielding SiGe/Si HBTs, a conventional way to reduce the base resistance is through ion implantation into the extrinsic base. The ion implantation will cause damage, however, to the base region. Such damage may ultimately lead to degradation in device performance.

To avoid the implantation damage, a raised extrinsic base (Rext) is formed by depositing an extra layer of polycrystalline silicon (or SiGe) atop the conventional SiGe extrinsic base layer. There are essentially two processes that may be utilized to achieve such a raised extrinsic base. The first process involves selective epitaxy; the other involves chemical-mechanical polishing (CMP).

In a typical selective epitaxy process, the raised extrinsic base polycrystalline silicon is formed before the deposition of the intrinsic base SiGe. The intrinsic base SiGe is deposited selectively onto the exposed surface of silicon and polycrystalline silicon inside an over-hanging cavity structure. The selective epitaxy with a cavity structure mandates stringent process requirements for good selectivity, and suffers from poor process control. U.S. Pat. Nos. 5,523,606 to Yamazaki and 5,620,908 to Inoh, et al. are some examples of prior art selective epitaxy processes.

As mentioned above, CMP can be applied to form a raised extrinsic base. U.S. Pat. No. 5,015,594 to Chu et al. discloses the formation of extrinsic base polysilicon by CMP. The isolation, which is achieved by thermal oxidation, is not feasible in high performance devices due to the high temperature thermal process.

U.S. Pat. No. 6,492,238 to Ahlgren, et al. provides a self-aligned process for forming a bipolar transistor with a raised extrinsic base, an emitter, and a collector integrated with a complementary metal oxide semiconductor (CMOS) circuit with a gate. An intermediate semiconductor structure is provided having a CMOS area and a bipolar area. An intrinsic base layer is provided in the bipolar area. A base oxide is formed across, and a sacrificial emitter stack of silicon layer is deposited on both the CMOS and bipolar areas. A photoresist is applied to protect the bipolar area and the structure is etched to remove the emitter stack silicon layer from the CMOS area only such that the top surface of the emitter stack silicon layer on the bipolar area is substantially flush with the top surface of the CMOS area. Finally, a polish stop layer is deposited having a substantially flat top surface across both the CMOS and bipolar areas suitable for subsequent chemical-mechanical polishing (CMP).

Despite being capable of forming an HBT having a raised extrinsic base, the self-aligned-CMP process disclosed in the '238 patent is complicated requiring many different processing steps to achieve the desired structure. As such, there still exists a need for providing a simple and reliable method for fabricating high-performance HBTs that have a raised extrinsic base.

SUMMARY OF INVENTION

One object of the present invention is to provide a simple, yet reliable method of fabricating a high-performance HBT in an integrated BiCMOS process.

A further object of the present invention is to provide a method of fabricating a HBT having a raised extrinsic base.

A still further object of the present invention is to provide a method of fabricating a high-speed HBT having a raised extrinsic base in which unity current gain frequency fT and unity unilateral power gain frequency fmax can reach 200 GHz or greater.

A yet further object of the present invention is to provide a method of fabricating an npn transistor in a BiCMOS process flow.

A still yet other object of the present invention is to provide a method of fabricating a HBT in which the reliability of the transistor is improved by reducing the leakage between the emitter region and the base region.

These and other objects and advantages are achieved in the present invention by providing and utilizing a patterned emitter landing pad stack in a non-self-aligned process. The patterned emitter landing pad stack of the present invention comprises polySi and/or SiN located atop an oxide. In the case when a combination of polySi and SiN is employed, the polySi is located atop the SiN. The patterned emitter landing pad stack which is located atop the base region serves the following three functions in the present invention: First, the patterned emitter landing pad stack aides in improving the alignment for the emitter-opening lithography. Secondly, the patterned emitter landing pad stack acts as an etch stop layer for the emitter opening etch. Thirdly, non-removed portions of the patterned emitter landing pad stack at the end of the process provides isolation between the emitter region and the raised extrinsic base region, together with the isolation spacers to be described later.

One aspect of the present invention is directed to a method of fabricating a high-performance HBT having a raised extrinsic base which includes the steps of:

forming a patterned emitter landing pad stack atop portions of a base region, said patterned emitter landing pad stack comprising at least a bottom oxide;

forming a doped semiconducting layer atop the patterned emitter landing pad stack as well as atop portions of the base region that does not contain said patterned emitter landing pad stack;

forming a material stack atop the doped semiconducting layer;

providing an emitter opening in portions of said material stack and said doped semiconducting layer stopping on an upper surface of said bottom oxide of said patterned emitter landing pad stack;

removing portions of said bottom oxide of said patterned emitter landing pad exposing a portion of said base region; and forming an emitter in said opening.

In a preferred embodiment of the present invention, the exposed portions of the bottom oxide are removed utilizing an etching method such as a chemical oxide removal process in which minimal undercut or substantially no undercut is formed beneath the patterned emitter landing pad stack.

In the present invention, the base region includes a monocrystalline region that is surrounded on either side by adjoining polycrystalline regions. The monocrystalline region is formed atop a Si substrate, whereas the polycrystalline regions are located atop trench isolation regions that are located in the Si substrate. The raised extrinsic base of the present invention includes the doped semiconducting layer that is located above the polycrystalline regions of the base region. Because of the presence of a monocrystalline region in the base region, there is no interface formed between that portion of the base region and the intrinsic base that is formed under the emitter opening. As such, the link resistance between these two regions is very low in the HBT of the present invention.

Another aspect of the present invention relates to a structure which comprises a base region having a monocrystalline region located atop a Si substrate and polycrystalline regions located atop trench isolation regions that are present in the Si substrate, with said monocrystalline region separating the polycrystalline regions;

a raised extrinsic base located atop the polycrystalline regions of the structure and part of the monocrystalline region that does not contain a patterned emitter landing pad stack;

an emitter opening located above said monocrystalline region, said emitter opening is defined by said patterned emitter landing pad stack; and an emitter region located in said emitter opening.

DETAILED DESCRIPTION

Figure 1:
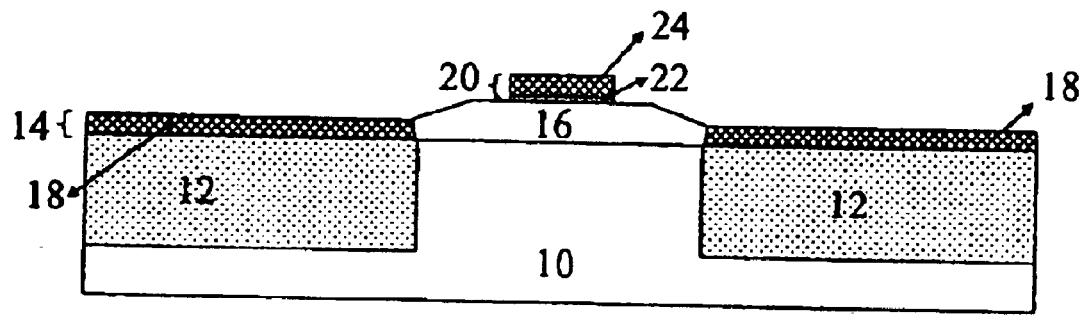
FIGS. 1–5 are pictorial representations (through cross sectional views) illustrating the basic processing steps that are employed in the present invention in forming a high-performance HBT.

The present invention, which provides a method for fabricating a high-performance transistor in a BiCMOS process in which a patterned emitter landing pad stack is employed as well as the resultant structure that is formed from the inventive method, will now be described in greater detail by referring to the drawings that accompany the present application. The drawings of the present application are directed to the HBT device area. For clarity, the CMOS device area as well as other areas of a typically BiCMOS structure are not shown in the drawings of the present application.

FIG. 1 shows an initial structure of the present invention. The initial structure includes a Si substrate 10 having trench isolation regions 12 formed therein. The Si substrate 10 may be a Si-containing semiconductor structure such as Si, SiGe or a silicon-on-insulator. Alternatively, the Si substrate 10 may be a Si layer such as epi-Si or a: Si formed atop of a semiconductor substrate. The Si substrate 10 may include various doping or well regions formed therein. Moreover, the Si substrate 10 may include a subcollector region which connects the HBT device to an adjacent collector region.

The trench isolation regions 12 that are located in the Si substrate 10 are made using conventional techniques that are well known to those skilled in the art including, for example, lithography, etching, trench filling, and planarization. The trench fill material includes a dielectric such as a high-density oxide or tetraethylorthosilicate (TEOS).

The initial structure shown in FIG. 1 also includes base region 14 located atop the Si substrate 10 as well as the trench isolation regions 12. The base region 14 is formed on exposed surfaces of the structure using a low temperature epitaxial growth process (typically 450–700° C.). The base region 14, which may comprise Si, SiGe or a combination of Si and SiGe, is monocrystalline 16 on top of exposed portions of Si substrate 10 and polycrystalline 18 on top of trench isolation regions 12. The region in which a change from monocrystalline to polycrystalline occurs is referred to in the art as the facet region. The base region 14 that is formed at this step of the present invention typically has a thickness after epitaxial growth of from about 200 to about 6000 Å. It is noted that monocrystalline region 16 is thicker than the polycrystalline regions 18.

Next, an oxide layer is formed atop the base region 14 using either an oxidation process or a conventional deposition process such as plasma-enhanced chemical vapor deposition (PECVD). The oxide layer, which serves as the bottom layer of the emitter landing pad, has a thickness of from about 5 to about 50 nm. Next, a layer of polySi and/or SiN, which serves as the top layer of the emitter landing pad, is formed atop the oxide layer utilizing a conventional deposition process such as CVD, PECVD, atomic layer deposition, chemical solution deposition, sputtering or evaporation. In embodiments in which a combination of polySi and SiN is employed, the polySi is located atop the SiN. Alternatively, and when the top layer of emitter landing pad is comprised of SiN, a thermal nitridation process may be used in forming the SiN layer. The layer of polySi and/or SiN has a thickness of from about 5 to about 200 nm.

The oxide and polySi and/or SiN layer are then patterned by lithography and etching to provide a patterned emitter pad stack 20 which includes bottom oxide layer 22 and top polySi and/or SiN layer 24. Note that the patterned emitter landing pad stack 20 is located atop the monocrystalline region 16.

Figure 2:
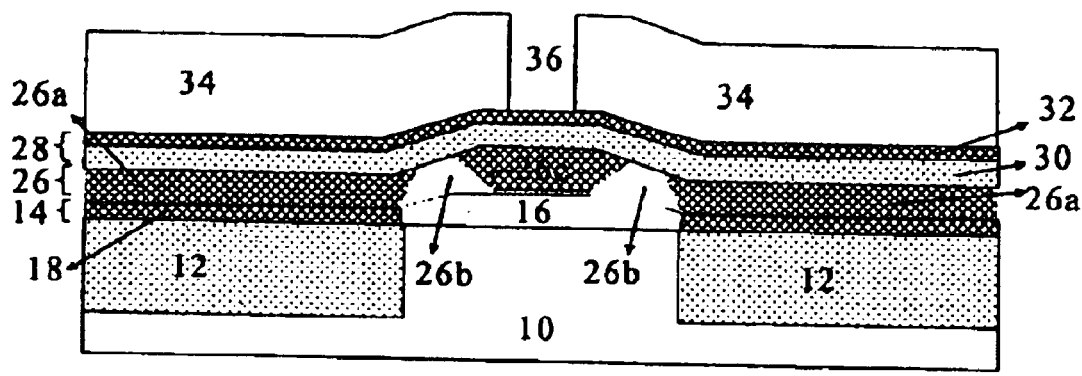

Following formation of the patterned emitter landing pad stack 20 atop the monocrystalline portion of the base region 14, a doped semiconducting layer 26 such as polysilicon, Si or SiGe (hereinafter doped layer 26) is formed on the patterned emitter landing pad stack 20 as well as atop portions of the base region 14 that do not contain the patterned emitter landing pad stack. The doped layer 26 can be a layer with a variable doping concentration, or Ge composition that can be grown in a state-of-the-art low temperature epitaxy system. The resultant structure is shown, for example, in FIG. 2. The doped layer 26 may also be formed by either an in-situ doped deposition process or by first depositing a polysilicon, Si or SiGe layer and then doping by ion implantation and annealing. In a preferred embodiment of the present invention, an in-situ doping deposition process is utilized. The doped layer 26 typically has a thickness from about 20 to about 400 nm.

It is noted that the portions of doped layer 26 that are located above the polycrystalline regions 18 of base region 14 form the raised extrinsic base of the inventive HBT. It is noted that doped layer 26 may have polycrystalline portions 26a and 26c and monocrystalline portions 26b. The polycrystalline portions 26a are located atop the polycrystalline portions 18 in base region 14. The polycrystalline portion 26c is located above the patterned emitter landing pad stack. The monocrystalline portion 26b is located atop monocrystalline region 16 of base region 14 that does not include the patterned emitter landing pad stack.

Following formation of the doped layer 26, a material stack 28 (see FIG. 2) comprising a bottom dielectric isolation layer 30 and an optional top polySi layer 32 is formed atop the doped layer 26. The bottom dielectric isolation layer may be comprised of any dielectric material including, for example, an oxide or nitride. It is noted that the top polySi layer 32 is optional therefore it may be omitted from the method of the present invention; the remaining drawings omit top polySi layer 32. The bottom dielectric isolation layer 30 is employed in the present invention to isolate the base from the emitter, while the top polySi layer 32 is employed in the present invention to protect the dielectric isolation layer. The material stack 28 is formed by first depositing or thermally growing the dielectric isolation layer 30 having a thickness of from about 10 to about 400 nm. After formation of the dielectric isolation layer 30, the optional polySi layer 32 having a thickness of from about 5 to about 300 nm may be formed by deposition.

A photoresist mask 34 having an opening 36 (see FIG. 2) is formed atop the material stack 28 by conventional lithography which includes applying a photoresist atop the material stack 28, exposing the photoresist to a pattern of radiation and developing the pattern into the photoresist by utilizing a conventional developer solution. The opening 36 in the photoresist mask 34 defines the emitter opening in the structure which will be formed in a subsequent step.

Figure 3:
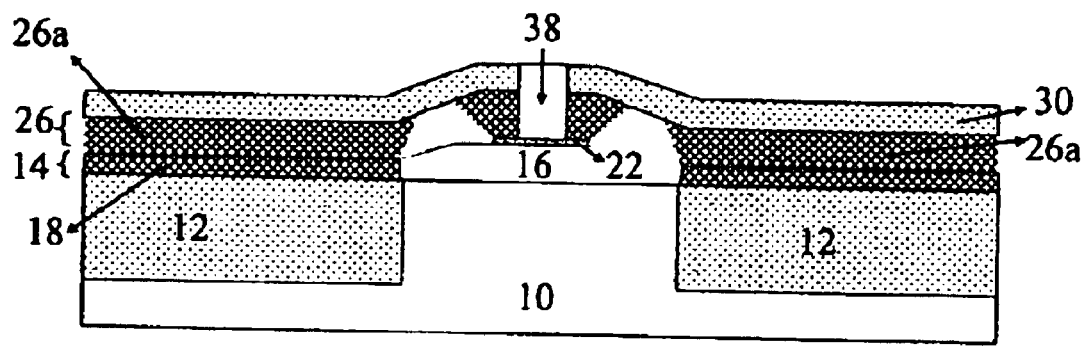

FIG. 3 shows the resultant structure after performing an etching step and removing the photoresist mask 34. Note that the etching step forms emitter opening 38 which extends from the upper surface of optional polySi layer 32 (if present), through dielectric isolation layer 30, doped layer 26 and polySi and/or SiN layer 24 stopping atop oxide layer 22 of patterned emitter landing pad 20. The etching is performed utilizing one or more etching steps in which dry etching such as reactive-ion etching (RIE), wet etching or a combination thereof is employed. As is shown in FIG. 3, the photoresist mask 34 is typically removed after the etching process.

An emitter region is then formed in the emitter opening 38. In one embodiment of the present invention, the emitter region is formed by first providing an insulating spacer 40 on each sidewall of the emitter opening 38. In this embodiment of the present invention, the insulating spacers 40 are comprised of a nitride or oxynitride and they are located atop the pad oxide layer 22. The insulating spacers 40 are formed by deposition followed by an etching step. Next, the exposed oxide layer 22 in the emitter opening 38 is removed from the structure providing the structure shown, for example, in FIG. 4. Note that the removing step exposes a surface portion of the underlying base region 14. In particular, the monocrystalline region 16 is exposed.

Figure 4:
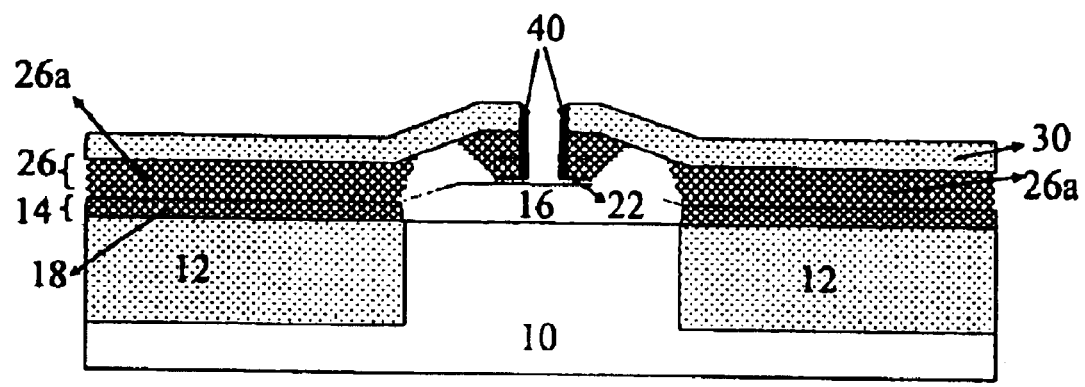

The exposed portions of oxide layer 22 are removed utilizing a chemical oxide removal (COR) process or similar process that induces minimal undercut or substantially no undercut of the patterned emitter landing pad stack. In the COR process, a gaseous mixture of HF and ammonia is employed. The ratio of HF to ammonia employed in the COR process is typically from 1:10 to 10:1, with a ratio of 2:1 being more highly preferred. Moreover, the COR process employed in the present invention is performed at a pressure between about 1 mTorr to about 100 mTorr and at a temperature of about 25° C. As is depicted in FIG. 4, the COR process provides minimal or substantially no undercut region beneath the insulating spacers 40.

Figure 5:
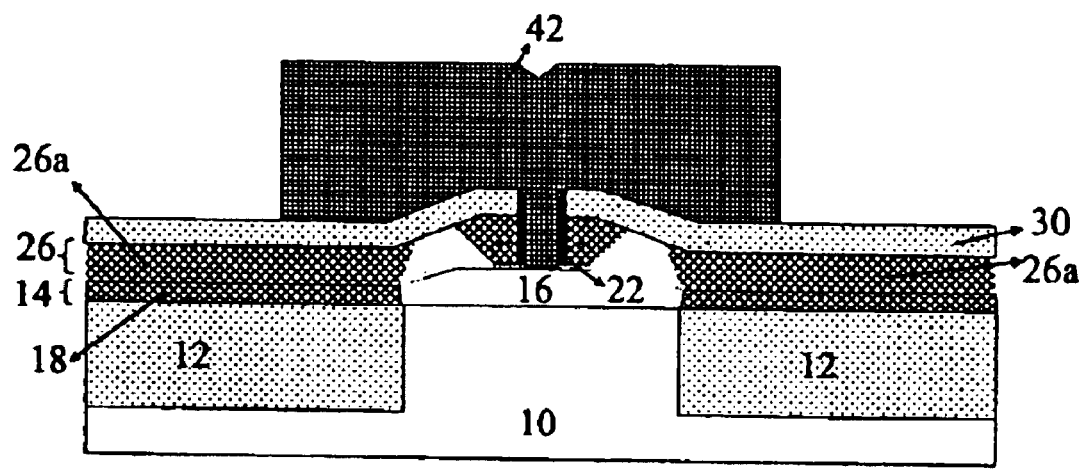

After the COR process, an emitter polysilicon 42 is deposited and patterned providing the structure shown, for example, in FIG. 5. The emitter polysilicon is a doped polysilicon material that can be formed utilizing an in-situ doping deposition process or deposition, followed by ion implantation and annealing. Note that the emitter polysilicon is in contact with the monocrystalline portion 16 of the base layer 14. It is should be noted that the doping of the emitter polysilicon 42, the base 14 and the collector can be tailored to provide either an npn or a pnp HBT, with preference given herein to npn HBT transistors.

Figure 6A:
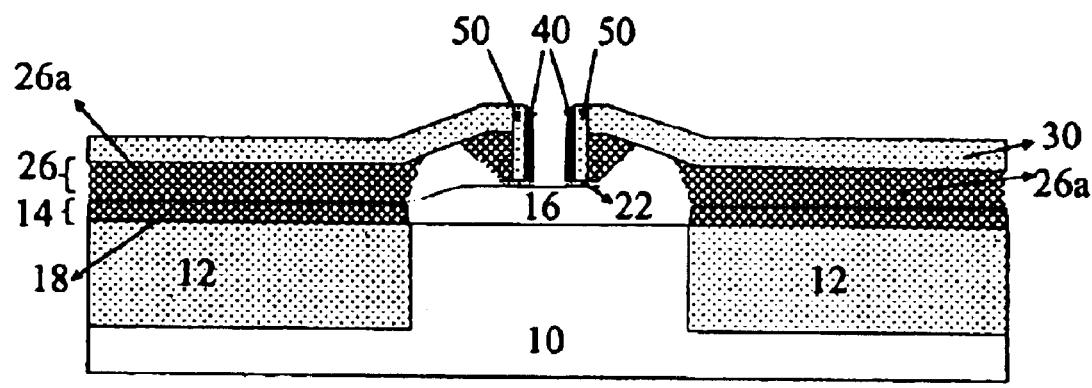
FIGS. 6A–6B are pictorial representations showing an alternative embodiment of the present invention which occurs after the emitter opening has been formed.
Figure 6B:
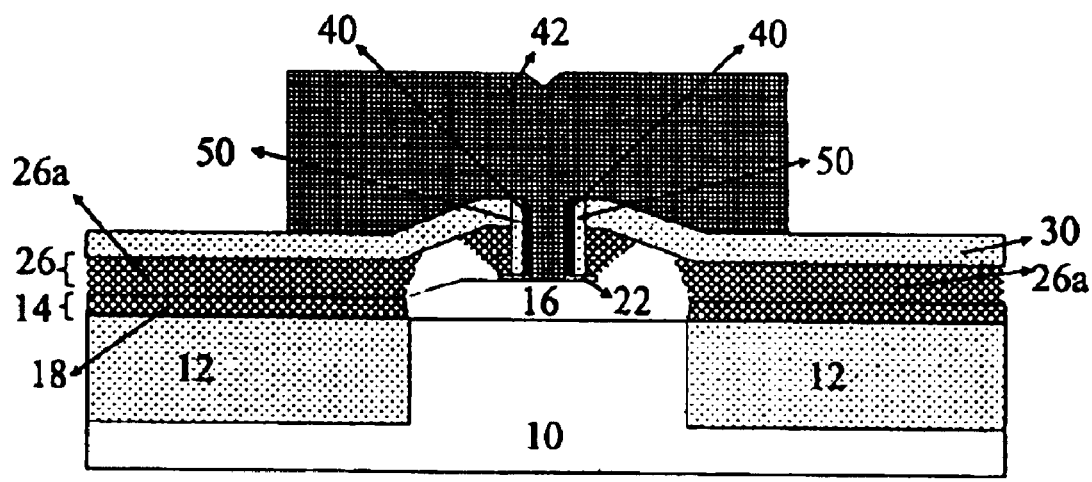

FIGS. 6A–6B show another embodiment of the present invention. In this embodiment of the present invention, the processing steps employed in fabricating the structure shown in FIG. 3 are first performed. Next, oxide or oxynitride 50 is formed on the sidewalls of the emitter opening by a thermal oxidation process, with or without additional active nitrogen sources. Following oxide 50 formation, insulating spacers 40 are formed on the sidewalls of oxide 50 as well as atop surface portions of oxide layer 22. The insulating spacers are formed as described above. FIG. 6A shows the HBT structure including oxide layer 50 and insulating spacers 40. FIG. 6B shows the structure that is formed after etching of pad oxide layer 22 and depositing and etching the emitter polysilicon 42.

The method and structure of the present invention improve isolation between the emitter and the raised extrinsic base.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for forming a high-performance heterojunction bipolar transistor comprising the steps of:
    forming a patterned emitter landing pad stack atop portions of a base region, wherein said base region comprises monocrystalline regions atop silicon and polycrystalline regions atop a dielectric, and said patterned emitter landing pad stack comprising at least a bottom;
    forming a doped semiconducting layer atop the patterned emitter landing pad stack as well as atop portions of the base region that does not contain said patterned emitter landing pad stack;
    forming a material stack atop the doped semiconducting layer;
    providing an emitter opening in portions of said material stack and said doped semiconducting layer stopping on an upper surface of said bottom oxide of said patterned emitter landing pad stack;
    removing portions of said bottom oxide of said patterned emitter landing pad exposing a portion of said base region; and
    forming an emitter in said opening.

2. The method of claim 1 wherein said base region is formed by a low temperature epitaxy process.

3. The method of claim 1 wherein said patterned emitter pad stack further includes a top layer of polySi, SiN or a stack of polySi atop SiN.

4. The method of claim 1 wherein said doped semiconductor layer comprises polycrystalline regions and monocrystalline regions, said monocrystalline regions are located on monocrystalline regions of the base region.

5. The method of claim 1 wherein said material stack comprises at least a dielectric isolation layer.

6. The method of claim 1 wherein said forming of the emitter opening comprises lithography and etching.

7. The method of claim 1 wherein prior to removing portions of said bottom oxide an insulating spacer is formed on sidewalls of the emitter opening.

8. The method of claim 1 wherein prior to removing portions of said bottom oxide an oxide layer is formed on sidewalls of the emitter opening and insulating spacers are formed on the oxide layer.

9. The method of claim 1 wherein said removing of portions of said bottom oxide comprises a chemical oxide removal step.

10. The method of claim 9 wherein said chemical oxide removal step is performed in a gaseous mixture of HF and ammonia.

11. The method of claim 1 wherein said emitter is formed by depositing a doped polysilicon layer and patterning the doped polysilicon layer.

* * * * *